United States Patent
Löbl et al.

(10) Patent No.: US 7,466,213 B2
(45) Date of Patent: Dec. 16, 2008

(54) RESONATOR STRUCTURE AND METHOD OF PRODUCING IT

(75) Inventors: Hans-Peter Löbl, Monschau-Imgenbroich (DE); Robert Frederick Milsom, Redhill (GB); Christof Metzmacher, Aachen (DE)

(73) Assignee: NXP B.V., Eindhoven (NL)

( * ) Notice: Subject to any disclaimer, the term of this patent is extended or adjusted under 35 U.S.C. 154(b) by 338 days.

(21) Appl. No.: 10/574,684

(22) PCT Filed: Sep. 27, 2004

(86) PCT No.: PCT/IB2004/051867

§ 371 (c)(1),
(2), (4) Date: Apr. 3, 2006

(87) PCT Pub. No.: WO2005/034345

PCT Pub. Date: Apr. 14, 2005

(65) Prior Publication Data

US 2008/0129414 A1  Jun. 5, 2008

(30) Foreign Application Priority Data

Oct. 6, 2003  (EP)  ................... 03103694

(51) Int. Cl.
*H03H 9/70* (2006.01)
*H03H 3/007* (2006.01)
*H03H 9/10* (2006.01)

(52) U.S. Cl. ................. 333/187; 333/189; 333/133; 310/322

(58) Field of Classification Search ............... 333/187, 333/189, 133; 310/332, 324
See application file for complete search history.

(56) References Cited

U.S. PATENT DOCUMENTS 6,936,837 B2 * 8/2005 Yamada et al. ............... 257/2

(Continued)

FOREIGN PATENT DOCUMENTS

EP    0 963 000    12/1999

(Continued)

OTHER PUBLICATIONS

T.W. Grudkowski et al: "Fundamental Mode VHF/UHF Bulk . . . " Proc. IEEE Ultrasonics Symposium; pp. 829-833, 1980.

(Continued)

*Primary Examiner*—Vibol Tan

(57) ABSTRACT

In order to provide a resonator structure (100) in particular a bulk-acoustic-wave (BAW) resonator, such as a film BAW resonator (FBAR) or a solidly-mounted BAW resonator (SBAR), comprising at least one substrate (10); at least one reflector layer (20) applied or deposited on the substrate (10); at least one bottom electrode layer (30), in particular bottom electrode, applied or deposited on the reflector layer (20); at least one piezoelectric layer (40), in particular C-axis normal piezoelectric layer, applied or deposited on the bottom electrode layer (30); at least one top electrode layer (50), in particular top electrode, applied or deposited on the bottom electrode layer (30) and/or on the piezoelectric layer (40) such that the piezoelectric layer (40) is in between the bottom electrode layer (30) and the top electrode layer (50), it is proposed that at least one dielectric layer (63, 65) applied or deposited in and/or on at least one space in at least one region of non-overlap between the bottom electrode layer (30) and the top electrode layer (50). The invention is also concerned with a method of making such resonator structure a its use.

11 Claims, 8 Drawing Sheets

U.S. PATENT DOCUMENTS

| | | | |
|---|---|---|---|
| 7,053,730 B2 * | 5/2006 | Park et al. | 333/133 |
| 2001/0048352 A1 * | 12/2001 | Klee et al. | 333/188 |
| 2007/0013463 A1 * | 1/2007 | Kim et al. | 333/187 |
| 2007/0063793 A1 * | 3/2007 | Jang et al. | 333/187 |
| 2007/0120624 A1 * | 5/2007 | Milsom et al. | 333/189 |

FOREIGN PATENT DOCUMENTS

| | | |
|---|---|---|
| EP | 1 170 862 | 1/2002 |
| EP | 1 280 042 | 1/2003 |
| WO | WO 99/59244 | 11/1999 |
| WO | WO 01/06647 | 1/2001 |
| WO | WO 01/24361 | 4/2001 |
| WO | WO 03/043188 | 3/2003 |
| WO | WO 03/058811 | 7/2003 |

OTHER PUBLICATIONS

K.M. Lakin "Development of Miniature Filters for Wireless Applications"; IEEE Transactions MTT-43; pp. 883-886; 1995.

* cited by examiner

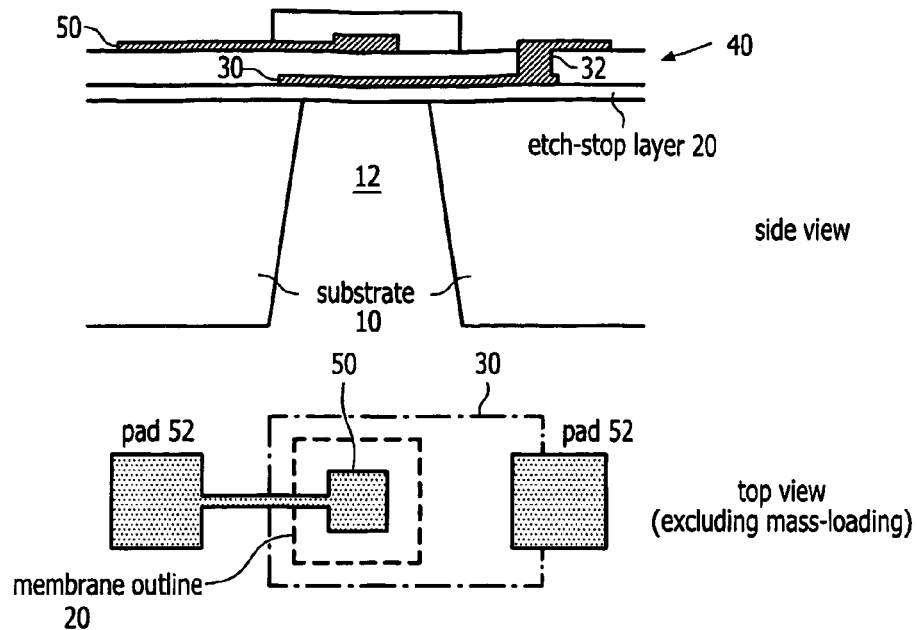
FIG. 1A/B
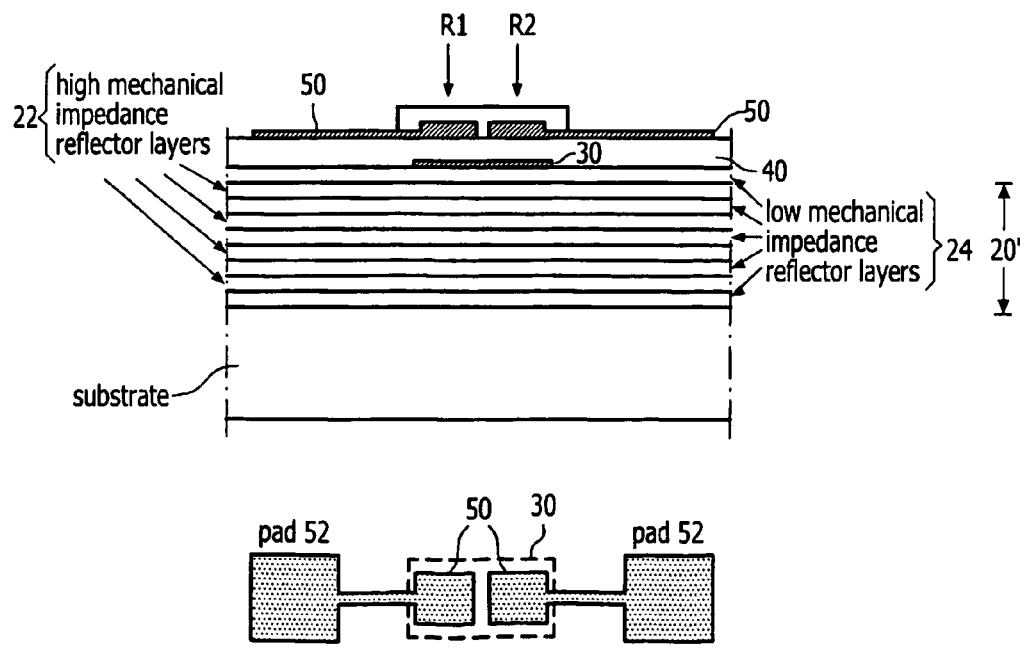
FIG. 2A/B

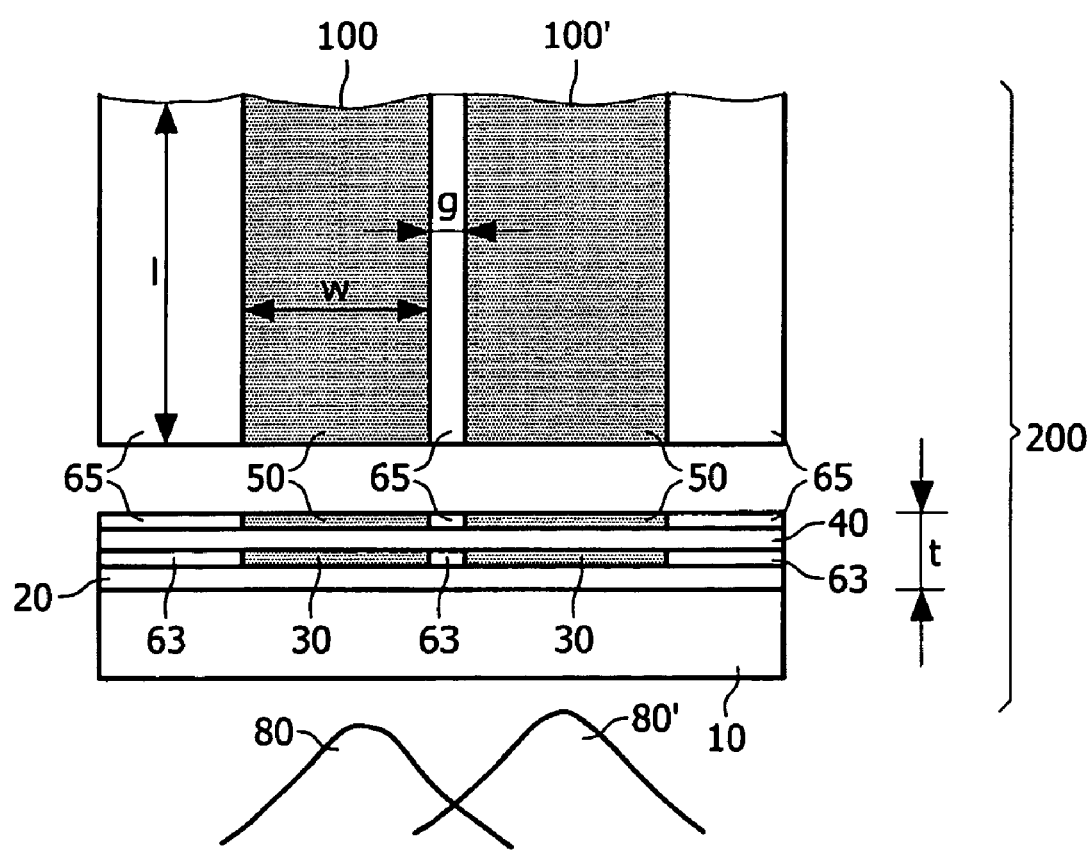
FIG. 15A/B/C

RESONATOR STRUCTURE AND METHOD OF PRODUCING IT

TECHNICAL FIELD

The present invention relates in general to piezoelectric resonators and filters comprising piezoelectric resonators.

In particular, the present invention relates to a resonator structure, in particular a bulk-acoustic-wave (BAW) resonator, such as a film BAW resonator (FBAR) or a solidly-mounted BAW resonator (SBAR), comprising at least one substrate; at least one reflector layer applied or deposited on the substrate; at least one bottom electrode layer, in particular bottom electrode, applied or deposited on the reflector layer; at least one piezoelectric layer applied or deposited on the bottom electrode layer; at least one top electrode layer, in particular top electrode, applied or deposited on the bottom electrode layer and/or on the piezoelectric layer such that the piezoelectric layer is in between the bottom electrode layer and the top electrode layer (cf. for example prior art document WO 99/59244 A2 or prior art document WO 01/06647 A1).

The present invention further relates to a method of producing a resonator structure, in particular a bulk-acoustic-wave (BAW) resonator, such as a film BAW resonator (FBAR) or a solidly-mounted BAW resonator (SBAR), comprising the following steps: (i) applying or depositing at least one reflector layer on a substrate; (ii) applying or depositing at least one bottom electrode layer, in particular bottom electrode, on the reflector layer; (iii) applying or depositing at least one piezoelectric layer on the bottom electrode layer; (iv) applying or depositing at least one top electrode layer, in particular top electrode, on the bottom electrode layer and/or on the piezoelectric layer such that the piezoelectric layer is in between the bottom electrode layer and the top electrode layer (cf. for example prior art document WO 01/24361 A1 or prior art document WO 03/058811 A1).

BACKGROUND AND PRIOR ART

R[adio]F[requency] filters based on thin-film bulk-acoustic-wave (BAW) resonators are being developed for applications such as mobile phones and wireless connectivity. The advantage of BAW technology is that devices are small, have good power handling (more than one Watt), cover the frequency range from about one to about twenty Gigahertz, and can exploit wafer-scale processing and packaging on silicon (Si).

Alternative technologies are ceramic electromagnetic (EM) wave filters and surface-acoustic-wave (SAW) filters. The former are relatively large and expensive for equivalent frequencies, while the latter require single-crystal materials such as lithium tantalate or quartz, are limited in practice to frequencies below about two Gigahertz, and also have limited power-handing capability.

A BAW resonator is essentially an acoustic cavity comprising a piezoelectric layer sandwiched between metal electrode layers. When an alternating electric signal is applied across these electrodes the energy is converted to mechanical form and a standing acoustic wave is excited. The principle mode of vibration in practical thin-film resonators is the fundamental thickness-extensional (TE1) acoustic mode, i. e. vibration is normal to the layers at a frequency for which half a wavelength of this mode is approximately equal to the total thickness of the cavity.

Two main types of resonator have been studied:

In the first of these resonator types, the film BAW resonator (=so-called FBAR; cf. T. W. Grudkowski, J. F. Black, T. M. Reeder, D. E. Cullen and R. A. Warner, "Fundamental mode VHF/UHF bulk acoustic wave resonators and filters on silicon", Proc. IEEE Ultrasonics Symposium, pp. 829 to 833, 1980), a thin membrane 20 forms the cavity as shown in FIG. 1A (=side view of a membrane-based film BAW resonator) and in FIG. 1B (=top view of the FBAR of FIG. 1A).

Typical dimensions and materials of the FBAR (cf. FIGS. 1A and 1B) are about 300 micrometers for the thickness of the substrate 10, for example being made of silicon (Si), about hundred micrometers for the air gap 12 within the substrate 10, about one micrometer for the thickness of the thin membrane 20 (=etch-stop layer), for example being made of silicon dioxide ($SiO_2$), about 100 micrometers for each top electrode 50 and the bottom electrode 30, and 1 μm for the respective pads 52 on the top electrodes 50 for example being made of aluminum (Al), and about three micrometers for the thickness of the C-axis normal piezoelectric layer 40, for example being made of aluminum nitride (AlN).

In the second of these resonator types, the solidly-mounted BAW resonator (=so-called SBAR; cf. K. M. Lakin, G. R. Kline and K. T. McCarron, "Development of miniature filters for wireless applications", IEEE Trans. MTT-43, pp. 2933 to 2416, 1995) shown in FIG. 2A (=side view of a Bragg-reflector BAW resonator) and in FIG. 2B (=top view of the SBAR of FIG. 2A), the lower free surface of the membrane 20 (cf. FIG. 1A) is replaced by a set 20' of acoustically mismatched layers 22, 24, which act to reflect the acoustic wave. This concept is analogous to the Bragg reflector in optics. The reflector layers 22, 24 are deposited on a solid substrate 10, typically glass or silicon (Si), so this structure is physically more robust than the FBAR.

Typical dimensions and materials of the SBAR (cf. FIG. 2A and 2B) are about 300 micrometers for the thickness of the substrate 10, for example being made of glass or silicon, about one micrometer for the thickness of each low mechanical impedance reflector layer 24, for example being made of silicon dioxide ($SiO_2$), about one micrometer for the thickness of each high mechanical impedance reflector layer 22, for example being made of tungsten (W) or tantalum pentoxide ($Ta_2O_5$), with the set 20' of acoustically mismatched layers 22, 24 being alternatingly formed of for example four high mechanical impedance reflector layers 22 and of for example four low mechanical impedance reflector layers 24 thus having a thickness of about eight micrometers, about 100 micrometers for each top electrode 50 and the bottom electrode 30, and 1 μm for the respective pads 52 on the top electrodes 50 for example being made of aluminum (Al), and about three micrometers for the thickness of the C-axis normal piezoelectric layer 40, for example being made of aluminum nitride (AlN).

Electrical connection to the bottom electrode may be through a via, as shown in FIG. 1. Alternatively, the via may be avoided by having the bottom electrode electrically floating, and forming two resonators in series, as shown in FIG. 2. With appropriate areas the two approaches are to first order electrically identical, and each may be used with either the FBAR or SBAR configuration.

A commonly used electrical equivalent circuit of a BAW resonator is shown in FIG. 3. $C_0$, $C_1$, $L_1$ and $R_1$ respectively characterize the static capacitance ($=C_0$), the motional capacitance ($=C_1$), the motional inductance ($=L_1$) and the motional resistance ($=R_1$) of the resonator itself, and together form the so-called Butterworth-Van Dyke BAW resonator model with added parasitics, i.e. the remaining components are electrical parasitics.

The three resistors characterize distinct types of energy loss: ohmic loss in the electrodes and interconnect ($=R_s$), loss due to stray electric fields in the substrate ($=R_p$), and mechanical losses associated with the resonance ($=R_1$).

Dielectric loss is typically negligible.

The equivalent-circuit model according to FIG. 3 is useful for first-pass design of filters (and other circuits using BAW resonators).

A more physically based representation of a BAW resonator is the so-called Novotny-Benes BAW resonator model. This model provides a solution of the field equations in one dimension (1D). In this model it is assumed that the "resonator" as viewed in the direction normal to the layers is defined by the region of overlap between top electrode and bottom electrode. This will be referred to as the "internal" region, the space outside the edges being referred to as the "external" region.

If the configuration is as shown in the top view in FIG. 1B or in FIG. 2B, i.e. the top electrode area is substantially smaller than the bottom electrode, then the resonator edges coincide with the edges of the top electrode (except in the region of the interconnect), so the top electrode substantially defines the internal region (and vice versa when the bottom electrode is smaller).

In the 1D model it is effectively assumed that the mechanical fields and the electrical fields have significant spatial variations only in the $x_3$-direction (i.e. direction normal to the layers) and are non-zero only in the internal region. All fields are assumed zero in the external region. Since the lateral dimensions of a typical resonator are much greater than layer thicknesses these are reasonable approximations in some respects.

The measured conductance G (=real part of resonator admittance Y) of a typical BAW resonator is compared over a wide band with predictions by both models in FIG. 4 (measurements: dashed line, Butterworth Van Dyke circuit model: solid line, !D Novotny Benes model: dotted line, anti-resonance fa). The level of agreement for the susceptance (=imaginary part of resonator admittance Y) is similar. The electrical parasitic components $C_p$, $L_5$, $R_p$ and $R_5$ are included in both models.

Most, but crucially not all, features of the response are predicted by the 1D physical model. It is the behavior close to anti-resonance, which is not predicted by either of these models, that is central to this proposal. The additional effects seen in the response are associated with the true behavior of acoustic fields and of electric fields at the resonator edges.

The 1D model is itself non-physical in the sense that an abrupt change from non-zero acoustic field to zero acoustic field is only possible at surfaces adjacent to free space. However, there is no such interface at a plane normal to the layers at a resonator edge (except over a very small area at an edge of the top electrode as shown in FIG. 1A and in FIG. 2A). The piezoelectric layer and other layers are continuous. A more realistic model therefore requires the fields in such planes to be continuous.

The principle-missing contributions in the 1D model are the guided acoustic modes supported by the layer structure. Although a full model requires a three-dimensional (3D) field analysis, it is possible to understand the behavior at edges using a two-dimensional (2D) model, in which the acoustic fields and the electric fields are assumed to be non-uniform in both the $x_3$-direction and the $x_1$-direction (, i. e. a direction parallel to the layers).

In this 2D model the resonator edges are assumed to be in the planes $x_1 = \pm W/2$ where W is the resonator width. The $x_2$-dimension of the resonator is, for the purposes of this analysis, assumed to be very great compared with the resonator width W, so fields are independent of $x_2$. Such a 2D model can also be expected to give a good qualitative understanding of edge behavior even when the $x_1$-dimension and the $x_2$-dimension are more comparable. The advantage of the 2D model over a 3D numerical analysis is that it retains the analytical form, and therefore the physical insight, of the 1D model. The whole solution is a superposition of partial modes whose component fields have (in general complex) exponential $x_1$- and $x_2$-dependence.

The proposal is based on the understanding that the set of thin-film layers provides an acoustic waveguide, which allows guided acoustic modes to travel parallel to the layers. At any given frequency a number of such modes may exist, each mode n having a characteristic discrete $x_1$-component of wave number $k_n$. Waveguide mode solutions are found as combinations of partial modes in each layer by solving the coupled two-dimensional electrical and mechanical wave equations subject to appropriate boundary conditions at the layer surfaces.

The wave number $k_n$ may be real (indicating that the mode propagates unattenuated in the $x_1$-direction), imaginary (indicating that the mode is attenuated in the $x_1$-direction, i. e. the mode is a cut-off mode or evanescent mode) or complex (indicating that the mode propagates but with attenuation in the $x_1$-direction).

The variation of the wave number $k_n$ with frequency is referred to as the dispersion relation for that mode. It is important in understanding resonator edge behavior to recognize that the internal and external regions provide distinct waveguides. Although, in general, the same-guided mode types are supported in each waveguide, their dispersion relations are different.

FIG. 5 and FIG. 6 respectively show dispersion curves for the internal region (cf. FIG. 5) and for the external region (cf. FIG. 6) of a typical FBAR configuration. The convention in these diagrams is that frequency (measured in Gigahertz) is indicated on the y-axis, and the real and imaginary parts of normalized $x_1$-component of wave number $k_n$ are indicated on the positive x-axis and negative x-axis respectively. (For convenience wave number $k_n$ is normalized at each frequency to that of an extensional wave propagating freely in the piezoelectric layer in the $x_3$-direction.)

The layer thicknesses were chosen to give a fundamental thickness extensional (TE1) mode resonant frequency of two Gigahertz (as predicted by the 1D model). The shapes of the dispersion curves are independent of total thickness, provided the ratios of all layer thicknesses are kept constant.

Due to symmetry the negatives of the wave numbers $k_n$ shown are also solutions, and in the case of both real and imaginary parts of wave number $k_n$ being non-zero its complex conjugate (and negative of its complex conjugate) are also solutions. The lowest five modes are shown in each plot of FIG. 5 and of FIG. 6: flexural (F1), extensional (E1), fundamental thickness shear (TS1), fundamental thickness extensional (TE1) and second harmonic thickness shear (TE2).

It should be noted that the TE1 and TE2 branches form a continuous curve for both waveguide types. For the internal region their wave numbers $k_n$ are real above about 1.8 Gigahertz except over the interval from about 2 Gigahertz (TE1 mode cut-off) to about 2.1 Gigahertz (TE2 mode cut-off) where one branch is imaginary.

Below 1.8 Gigahertz the two branches are complex conjugates. This indicates that the TE1 mode and the TE2 mode have similar field distributions and are likely to be strongly coupled at all frequencies. For the external region the two branches are complex conjugates below about 2.4 Gigahertz, and the two cut-off frequencies are off the diagram and therefore above 2.5 Gigahertz.

The other three modes (F1, E1 and TS1) have real wave numbers $k_n$ in both internal and external regions and therefore propagate unattenuated over the entire frequency range shown. All the higher modes (not shown) are strongly attenuated in this frequency range.

The condition of continuity of fields at resonator edges can only be satisfied by a linear superposition of the driving electro-acoustic field (, i.e. the 1D solution) and a combination of the guided modes in both internal and external regions. In principle, all guided modes in each region must be excited to some extent, since the continuity condition cannot otherwise be satisfied for all values of $x_3$ in the edge plane.

In practice a few modes dominate. Here it is important to realize that the $x_3$-dependence of the fields in each mode is a function of frequency, being close to the 1D solution for frequencies close to cut-off. Since the cut-off frequencies (particularly those of the dominant TE1 and TE2 modes) in the two regions differ considerably, the fields associated with nominally the same mode in the two regions also differ considerably.

Therefore a substantial contribution from other modes is needed to ensure continuity of the net field. This phenomenon is known as mode-conversion. One of its effects is that energy is lost through unattenuated propagation of the F1, E1 and TS1 modes away from the resonator.

Standing waves also occur due to guided modes excited at resonator edges traveling in opposite directions in the internal region. These standing waves are commonly referred to as inharmonic, because they are strongest at frequencies where an integer number of half-wavelengths of a guided mode corresponds approximately to the resonator width W.

The effect of edges on resonator admittance Y is therefore to introduce both loss which shows up as a contribution to conductance G (=real part of resonator admittance Y), due to guided modes scattered away from the resonator, and ripple in both real and imaginary parts of resonator admittance Y due to guided modes scattered back into the resonator. Although wave guiding and dispersion in an SBAR configuration is more complicated than in an FBAR configuration, similar arguments apply.

In the context of filter design the two frequencies of greatest interest in the response of a resonator are the resonance $f_r$ and the anti-resonance $f_a$, the frequencies of its maximum and minimum admittance respectively. For high Q-factor resonances these are very close to the maximum and minimum of conductance. In the example whose response is shown in FIG. 4 these are at approximately 1.985 Gigahertz and 2.03 Gigahertz respectively.

FIG. 7 shows the very fine detail from FIG. 4 in the vicinity of the anti-resonance $f_a$. This demonstrates the area of greatest disagreement between measurement and both the equivalent circuit and 1D simulation models. The measured response clearly shows the ripple and additional conductance (, i.e. loss) near the anti-resonance $f_a$ discussed above, which can only be explained by modeling behavior due to the edges.

All in all, it can be stated that acoustic energy escaping from the edges of resonators has been identified as one of the most significant sources of loss, and this occurs as a result of acoustic mode conversion at the physical discontinuity provided by the edge.

DISCLOSURE OF THE INVENTION: PROBLEM, SOLUTION, ADVANTAGES

Starting from the disadvantages and shortcomings as described above and taking the prior art as discussed into account, an object of the present invention is to significantly reduce loss in thin-film BAW resonators and hence to achieve minimal insertion loss in thin-film BAW filters because R[adio]F[requency] filters containing such thin-film BAW resonators are typically required to have very low insertion loss, due to requirements such as receiver sensitivity and transmitter power consumption.

In this context, a further goal of the present invention is to provide a simple resonator structure with good electrical response at the operation frequency.

The objects of the present invention are achieved by a resonator structure comprising the features of claim 1, by a filter comprising the features of claim 6 as well as by a method of producing such resonator structure comprising the features of claim 8. Advantageous embodiments and expedient improvements of the present invention are disclosed in the respective dependent claims.

The present invention is based on the technical principle of an enhanced-Q[uality] thin-film BAW resonator using planarisation.

It is proposed that at least one planarisation step is introduced to minimize the mode conversion and therefore to reduce the loss. It is also proposed that other advantages such as single-mode operation of the present resonator structure as well as a filter containing at least one of such resonators based on lateral acoustic coupling, both with resonator dimensions consistent with typical electrical impedance requirements may accrue from this new technique.

The losses discussed above will be reduced if the cut-off frequency of the TE1 mode (and also the cut-off frequency of the TE2 mode coupled to the cut-off frequency of the TE1 mode) in the external region is brought much closer to the corresponding cut-off frequency in the internal region.

In this context, the term "internal region" refers to the region of overlap between the bottom electrode layer and the top electrode layer whereas the term "external region" refers to the region of non-overlap between the bottom electrode layer and the top electrode layer; in other words, the external region is situated outside the edges of the internal region.

This has the effect that the field distributions associated with these TE1 and TE2 modes are then much more closely matched in the planes of the resonator edges. The excitation of other modes, in particularly the modes, which propagate in the external region, is then much weaker, and the effects of loss and ripple are greatly reduced.

According to the teaching of the present invention, it is proposed that the required reduction in cut-off frequency in the external region be achieved by deposition of an additional dielectric layer in the external region.

In a preferred embodiment of the present invention, complete removal of the acoustic discontinuity implies that the additional dielectric layer is of equal thickness and acoustic impedance to that of the top electrode. For example, an additional dielectric layer of silicon dioxide ($SiO_2$) gives a good mechanical impedance match to an aluminum (Al) top electrode.

Equal thickness implies planarisation, i.e. the dielectric layer is deposited in the external region in such way that the total thickness of the external region is equal to the total thickness of the internal region thus implying a planarisation of the resonator structure.

Alternatively, an additional dielectric layer whose thickness is less than the thickness of the electrode still provides some improvement with respect to the mechanical impedance match, i. e. the thickness of the dielectric layer as deposited in the external region is chosen other than that required for planarisation.

In any case, the electrode dimensions and the thickness of the external region are preferably adjusted to energy-trap a single mode, with the electrode area being consistent with impedance requirements.

With full planarisation, i.e. with providing a completely flat top surface the only significant discontinuity is that in the electric field. This discontinuity is required to define the resonator, but is also essential for trapping the energy of the wanted mode. Since energy trapping is weaker in planarised resonator devices, the trapping of a single mode by a resonator structure of usable area is possible; this provides filters with cleaner responses.

A method to achieve single-mode operation is also described in prior art document WO 01/06647 A1. This prior art document introduces a frame-like region of prescribed width between the internal region and the external region with thickness typically greater than that of either. The issues of mode conversion and loss are not addressed by prior art document WO 01/06647 A1.

The present invention further relates to a filter comprising at least one resonator structure as described above. An especially preferred embodiment of the present invention is directed to a filter with more than one closely-spaced resonator structure with widths of gaps between the resonators adjusted to give appropriate acoustic coupling and compatibility with mask design rules.

In other words, the method according to the present invention also allows the design of a filter based on laterally acoustically coupled resonators, in which the coupling gap is not unreasonably small. (The gap would need to be extremely small and difficult to control for strong energy trapping.)

Single-mode operation and lateral coupling are standard in the long-established quartz crystal technology where typical frequencies are of the order of Megahertz. Such designs are automatically made possible in that technology by the fact that the acoustic discontinuities at electrode edges are intrinsically very small due to the electrode thickness being of the order of 0.1 percent of the resonator thickness, rather than the ten percent or more typical in thin-film technology without the planarisation step.

The invention also relates to a resonator structure having electrodes whose edges define the edge of the resonator, which are thin compared to the total thickness of the resonant cavity.

Especially preferred is a resonator structure having electrode thickness $d_e$ divided by thickness of resonant cavity $d_{rc}$ according to $1\% \leq d_e/d_{rc} \leq 10\%$.

An alternative method of bringing the cut-off frequencies of the internal and external regions closer together is to design either the top or the bottom electrode or both electrodes thin. This applies especially to the electrode whose edges substantially determine the resonator area. In a preferred embodiment a resonator operating e.g. at 1.95 GHz both top and bottom electrode would be approx. 50 nm thick. Generally the ratio between electrode thickness and thickness of the resonator cavity should be small (e.g. 2.5%). Despite the fact that a thin electrode improves the resonator Q in anti-resonance, it will reduce the resonance Q by its increased sheet resistance. This limits the latter method to an electrode thickness of approx. 1% of the total resonator cavity thickness. Preferably the electrodes should have tapered edges to reduce the physical discontinuity at the edges of the resonator region.

BRIEF EXPLANATION OF THE DRAWINGS

The present invention finally relates to the use of at least one resonator structure as described above and/or of at least one filter as described above in receivers and/or in transmitters.

As already discussed above, there are several options to embody as well as to improve the teaching of the present invention in an advantageous manner. To this aim, reference is made to the claims dependent on claim 1 and on claim 7; further improvements, features and advantages of the present invention are below explained more in detail with reference to eight preferred embodiments (cf. FIG. 8 to FIG. 15C) by the way of example and to the accompanying drawings where FIG. 1A shows schematically a cross sectional view of a membrane-based film bulk-acoustic-wave resonator (FBAR) according to the prior art;

FIG 1B shows schematically a top view of the FBAR of FIG. 1A;

FIG. 2A shows schematically a cross sectional view of a Bragg-reflector bulk-acoustic-wave resonator (SBAR) according to the prior art;

FIG. 2B shows schematically a top view of the SBAR of FIG. 2A;

FIG. 3, solid line) as well as by the Novotny-Benes BAW resonator model (=1D model, dotted line) over a wide frequency band f;

FIG. 8 shows schematically a cross sectional view of a first embodiment of a resonator structure according to the present invention being fabricated in accordance with the method according to the present invention;

FIG. 9 shows schematically a cross sectional view of a second embodiment of a resonator structure according to the present invention being fabricated in accordance with the method according to the present invention;

FIG. 10 shows schematically a cross sectional view of a third embodiment of a resonator structure according to the present invention being fabricated in accordance with the method according to the present invention;

FIG. 11 shows schematically a cross sectional view of a fourth embodiment of a resonator structure according to the present invention being fabricated in accordance with the method according to the present invention;

FIG. 12 shows schematically a cross sectional view of a fifth embodiment of a resonator structure according to the present invention being fabricated in accordance with the method according to the present invention;

FIG. 13 shows schematically a cross sectional view of a sixth embodiment of a resonator structure according to the present invention being fabricated in accordance with the method according to the present invention;

FIG. 14 shows schematically a cross sectional view of a seventh embodiment of a resonator structure according to the present invention being fabricated in accordance with the method according to the present invention;

FIG. 15A shows schematically a top view of an eighth embodiment of a structure of two resonators according to the present invention being fabricated in accordance with the method according to the present invention;

FIG. 15B shows schematically a cross sectional view of the structure of two resonators of FIG. 15A; and FIG. 15C shows schematically the widened and overlapping acoustic fields of the structure of two resonators of FIG. 15A and of FIG. 15B.

Above in conjunction with the description of the prior art reference was made to FIG. 1A to FIG. 15C. The same reference numerals are used for corresponding parts in the FIG. 1A to FIG. 15C.

BEST WAYS OF EMBODYING THE PRESENT INVENTION

Figure 3:
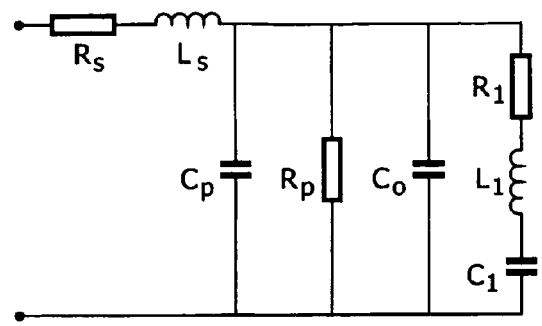
FIG. 3 shows a schematic view of an equivalent-circuit model, i.e. a Butterworth-Van Dyke BAW resonator model with added parasitics according to the prior art.
Figure 4:
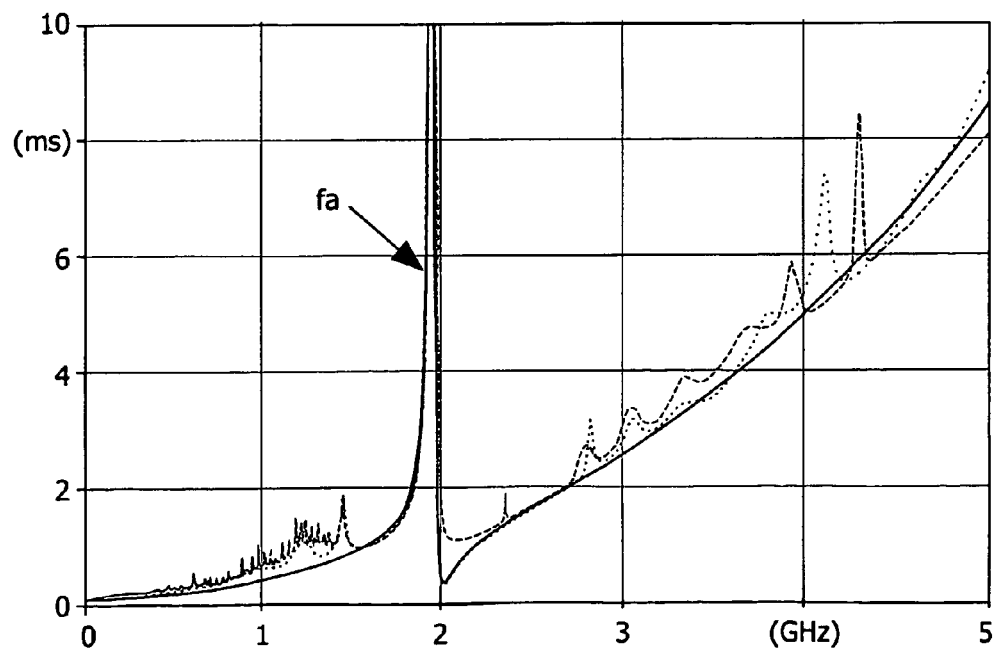
FIG. 4 illustrates a diagram showing the measured (dashed line) conductance G (=real part of resonator admittance Y) as measured in Milli-Siemens (=mS=$10^{-3}$/Ohm) of a typical bulk-acoustic-wave (BAW) resonator in comparison with predictions by the Butterworth-Van Dyke BAW resonator model (=equivalent-circuit model; cf.
Figure 5:
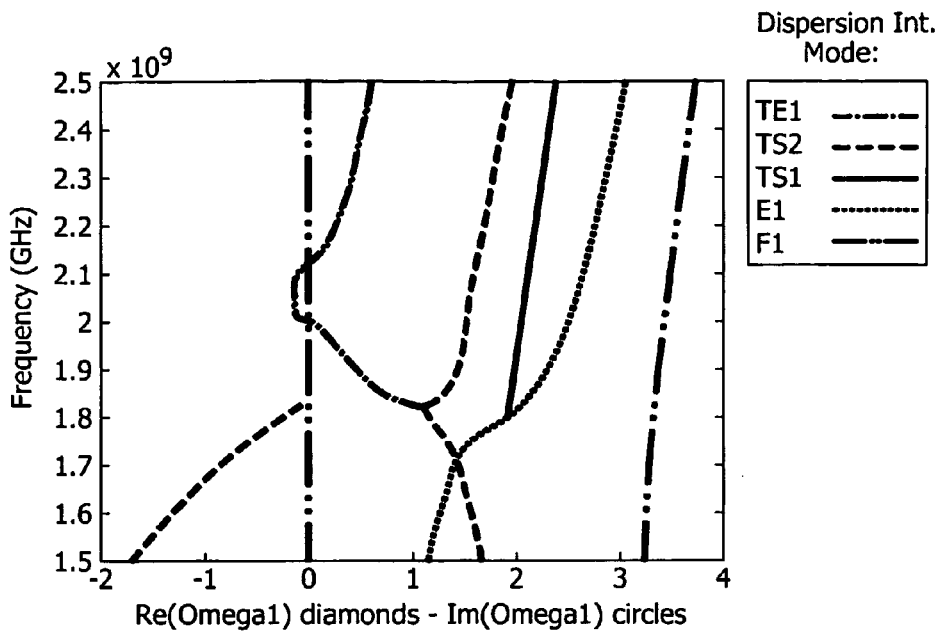
FIG. 5 illustrates a diagram showing the dispersion curves for the lowest five modes, i.e. flexural mode (F1), extensional mode (E1), fundamental thickness shear mode (TS1), fundamental thickness extensional mode (TE1) and second harmonic thickness shear mode (TE2), in the "internal" waveguide of a typical FBAR configuration.
Figure 6:
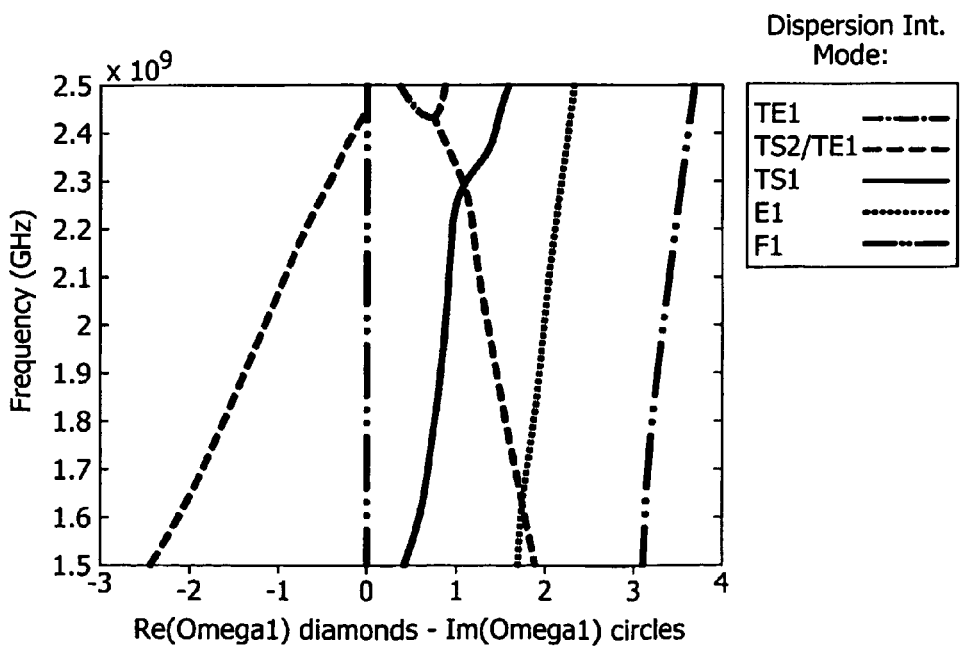
FIG. 6 illustrates a diagram showing the dispersion curves for the lowest five modes, i.e. flexural mode (F1), extensional mode (E1), fundamental thickness shear mode (TE1), fundamental thickness extensional mode (TE1) and second harmonic thickness shear mode (TE2), in the "external" waveguide of a typical FBAR configuration.
Figure 7:
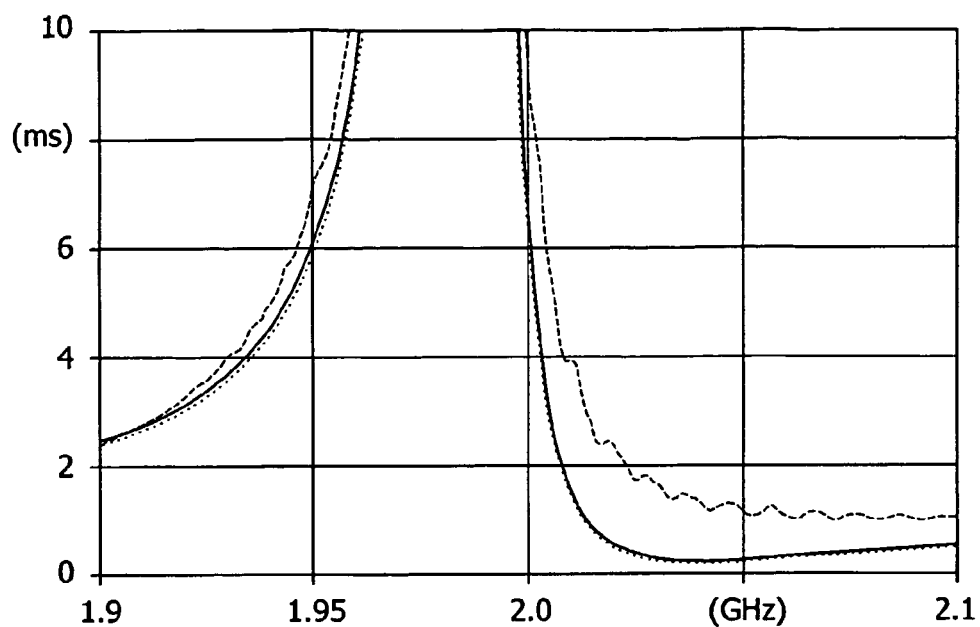
FIG. 7 shows a very fine detail from FIG. 4 close to the anti-resonance frequency $f_a$=2.03 Gigahertz.

In the following, several examples of bulk-acoustic-wave (BAW) resonators 100, 100' are described making use of the planarisation proposal according to the present invention; in particular, eight different embodiments of the present invention are shown in FIG. 8 to FIG.15C, these eight embodiments being produced as proposed by the method according to the present invention:

The substrate 10 may be for instance silicon (Si), glass, gallium arsenide (GaAs), or ceramic.

An acoustic reflector 20 consisting of pairs of $f\textit{E}/4$ layers having high and low acoustic impedance is applied or deposited on the substrate 10. The layers may be silicon dioxide/tantalum pentoxide ($SiO_2/Ta_2O_5$), silicon dioxide/tungsten ($SiO_2/W$), silicon dioxide/aluminum nitride ($SiO_2/AlN$), silicon dioxide/hafnium oxide ($SiO_2/HfO_2$), silicon dioxide/molybdenum ($SiO_2/Mo$), silicon dioxide/platinum ($SiO_2/Pt$). Instead of silicon dioxide ($SiO_2$) also a low-density material may be used, for example aerogel, xerogel, polymer.

The bottom electrode 30 is applied or deposited on the reflector layer 20 and may consist of aluminum (Al), aluminum:silicon (Al:Si), aluminum:copper (Al:Cu), molybdenum (Mo), platinum (Pt), tungsten (W), or combinations of these materials.

A planarisation layer 63 is applied or deposited on top the bottom electrode 30 and patterned so that the planarisation layer 63 has the same height as the bottom electrode 30. This can be achieved by precise lithographic means or alternatively by depositing a planarisation layer 63 of at least the thickness of the bottom electrode 30 and by subsequent polishing down the planarisation layer 63 until the surface of the bottom electrode 30 is reached. This can be done for instance by chemical mechanical polishing (CMP).

The planarisation layer 63 may consist of acoustically suited dielectrics such as silicon dioxide ($SiO_2$), tantalum pentoxide ($Ta_2O_5$), polymers, benzocyclobutene (BCB), polyimide, etc.

Then a C-axis normal piezoelectric layer 40 is applied or deposited on the bottom electrode layer 30 and/or on the planarisation layer 63. The piezoelectric layer 40 may consist of aluminum nitride (AlN), zinc oxide (ZnO), lead zirconate titanate (PZT), potassium niobate ($KNbO_3$) etc.

The top electrode 50 is applied or deposited on the piezoelectric layer 40 and may consist of aluminum (Al), aluminum:silicon (Al:Si), aluminum:copper (Al:Cu), molybdenum (Mo), platinum (Pt), tungsten (W), or combinations of these materials.

Underneath the bottom electrode 30 and/or the top electrode 50 an adhesion layer consisting of for instance titanium (Ti) or chrome (Cr) or titanium nitride (TiN) may be deposited.

The top electrode 50 again is planarised. Here the same techniques as for the bottom electrode 30 may be applied. The planarisation layer 65 relating to the top electrode 50 may consist of the same acoustically suited dielectric material(s) such as silicon dioxide ($SiO_2$), tantalum pentoxide ($Ta_2O_5$), polymers, benzocyclobutene (BCB), or polyimide as the planarisation layer 63 relating to the bottom electrode 30. However, also different materials may be used.

Figure 8:
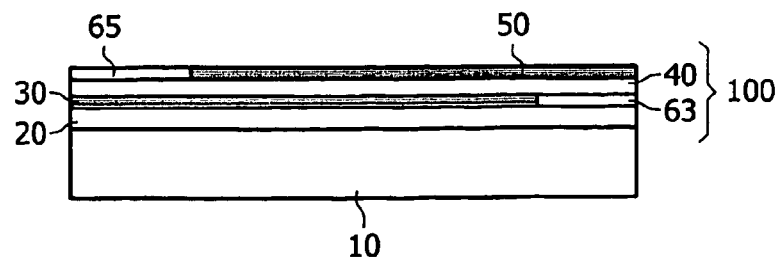

FIG. 8 shows a solidly-mounted BAW resonator (SBAR) 100 on a substrate 10 with an acoustic reflector stack 20. Both the bottom electrode layer 30 and the top electrode layer 50 of the SBAR are planarised using a planarisation layer 63 (for the bottom electrode layer 30) as well as a planarisation layer 65 (for the top electrode layer 50).

Figure 9:
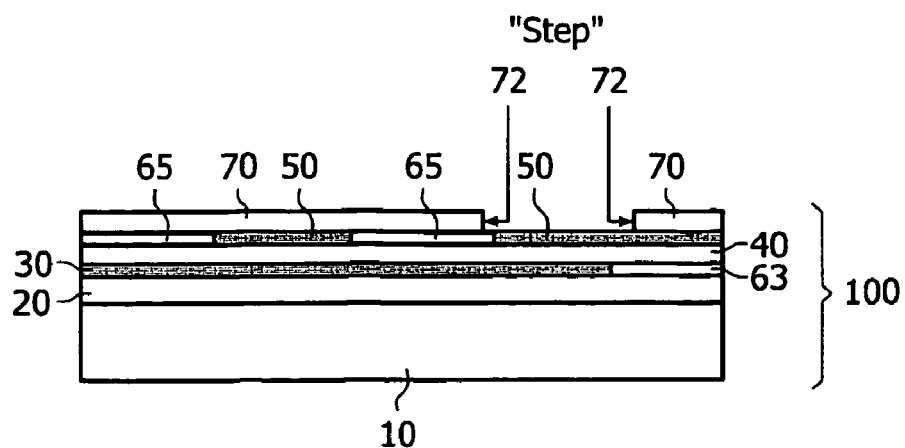
Figure 10:
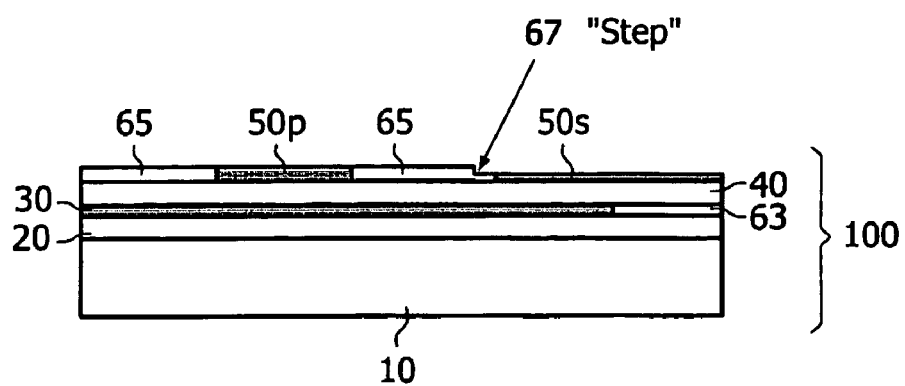

FIG. 9 and FIG. 10 show two examples how mass-loading of the parallel resonators or shunt resonators, which is necessary to realize filters, such as conventional lattice or ladder filters of the SBAR or FBAR type, can be combined with a planarisation of the top electrode 50.

In this context, FIG. 9 illustrates the planarization of both the bottom electrode 30 (by means of the dielectric layer 63) and the top electrode 50 (by means of the dielectric layer 65). In addition, mass-loading is also done by applying a separate mass loading layer 70, which is opened, i. e. removed on the series resonator. Hereby a step 72 in the mass-loading layer 70 is created which is kept sufficiently far away from the series resonator defined by the top electrode 50.

FIG. 10 also illustrates the planarization of both the bottom electrode 30 (by means of the dielectric layer 63) and the top electrode 50p, 50s (by means of the dielectric layer 65). In this third exemplary embodiment of the present invention, mass-loading is done by use of top electrodes 50p, 50s of different thickness for the shunt resonator and for the series resonator: whereas a thick top metal layer 50p has been applied on the shunt resonator, a thin top metal layer 50s has been applied on the series resonator.

Subsequently a planarization layer 65 is applied and polished until the surface of the top-metallization 50p of the shunt resonator is reached. Since the top electrode 50s of the series resonator is then still buried under the planarisation layer 65, the planarisation layer 65 is opened, i. e. removed lithographically at the position of the series resonator. This creates a step 67 in the planarization layer 65 near the series resonator, which is kept sufficiently far away from the series resonator defined by the top electrode 50s.

Figure 11:
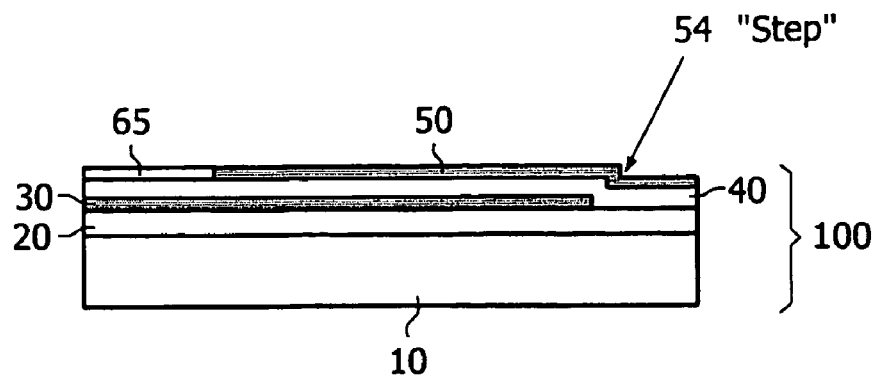

In FIG. 11 only the top electrode 50 (with its step 54) of an SBAR 100 is planarised using a planarisation layer 65. Of course another embodiment of the invention (not shown in FIG. 8 to FIG. 15C) may use the planarisation 63 of the bottom electrode 30 only.

Figure 12:
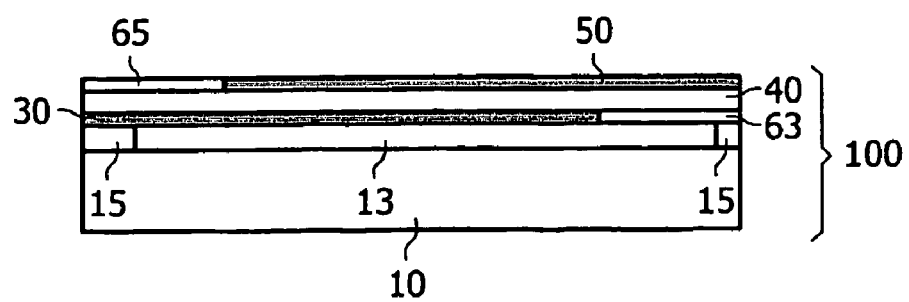

In FIG. 12 the planarisation of both the bottom electrode 30 (by means of the dielectric layer 63) and the top electrode 50 (by means of the dielectric layer 65) of a film BAW resonator (FBAR) 100 is shown using a planarisation layer 63 (for the bottom electrode layer 30) as well as a planarisation layer 65 (for the top electrode layer 50).

An air gap 13 between the substrate 10 and the bottom electrode 30 (with its planarisation layer 63) is formed by removing a sacrificial layer. At the edges of this air gap 13, an additional support layer 15 is formed.

Figure 13:
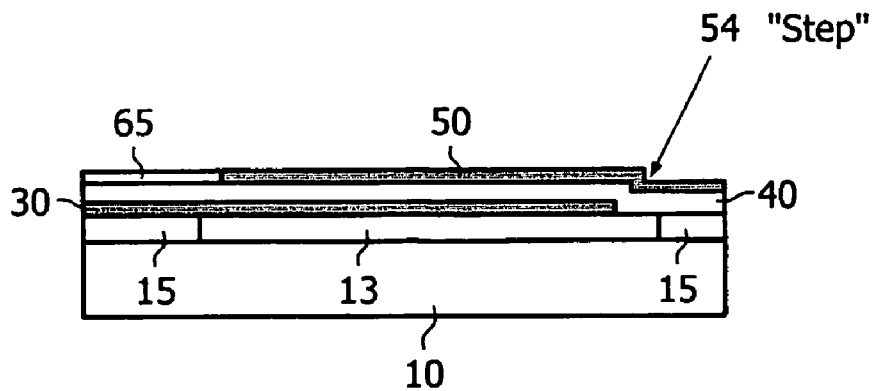

In FIG. 13 only the top electrode 50 of an FBAR 100 is planarised using a planarisation layer 65. Of course another embodiment of the invention (not shown in FIG. 8 to FIG. 15C) may use the planarisation 63 of the bottom electrode 30 only.

As in the fifth embodiment of the present invention according to FIG. 12, also in this sixth embodiment of the present invention according to FIG. 13 an air gap 13 between the substrate 10 and the bottom electrode 30 (and with parts of the piezoelectric layer 40) is formed by removing a sacrificial layer. At the edges of this air gap 13, an additional support layer 15 is formed.

Figure 14:
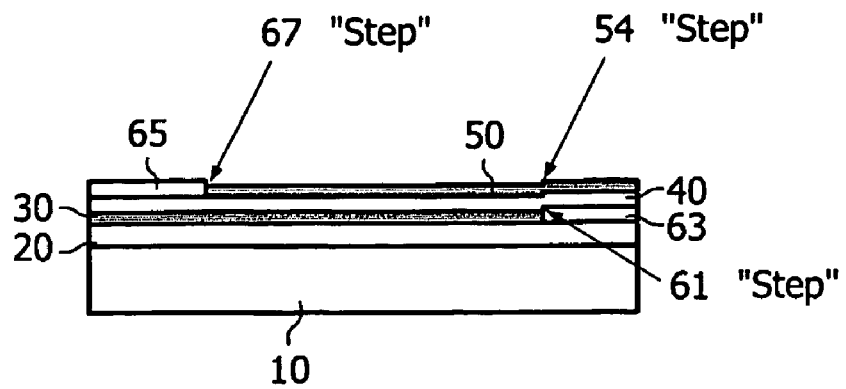

In FIG. 14 the first dielectric layer 63 (with its step 61) and the second dielectric layer 65 (with its step 67) are acoustically designed such that only a single or specific acoustic mode is energy-trapped by the SBAR structure 100. Like in the first embodiment (cf. FIG. 8) the two dielectric layers 63, 65 are adapted in thickness such that only a specific acoustic mode is trapped. The layer 63 and 65 may be ten times thicker and/or thinner than the corresponding bottom metallization 30 and the corresponding top metallization 50.

Alternatively the dielectric planarization layers 63, 65 can also be designed such that energy trapping of a specific mode is reduced and the acoustic fields 80, 80' of neighboring resonators 100, 100' overlap. This leads then to an improved acoustic coupling between adjacent resonators 100, 100' and makes laterally acoustically coupled resonator structures technologically feasible.

This principle of acoustically coupled resonators 100, 100' is shown in FIG. 15A (=top view), in FIG. 15B (=cross sectional view) as well as in FIG. 15C:

Two resonators 100, 100' of width w and with thickness t are separated by a distance g. Planarisation layers 63, 65 are applied. These two dielectric layers 63, 65 reduce energy trapping of vibration modes. The acoustic fields 80, 80' of the individual resonators 100, 100' are widened and overlap (cf. FIG. 15C).

Typical values for the width w of the resonators 100, 100' range from about 1×t to about 50×t, where t is the thickness of the resonator 100, 100', typically ranging from about 0.1 micrometer to about ten micrometer. The distance g between the resonators 100, 100' typically ranges from about w/10 to about w. To enhance the acoustic coupling the length l of the resonators 100, 100' should be (equal to or) larger than the width w of the resonators 100, 100'.

Finally it should be mentioned with regard to the eight exemplary embodiments of the present invention as illustrated in FIG. 8 to FIG. 15C that not only discontinuities in the layer stack (vertical layout) of the resonator structure 100 contribute to mode conversion and to acoustic loss, but also discontinuities in the lateral resonator layout.

Therefore, when designing a resonator structure 100 sharp corners and sharp edges should be avoided. A resonator structure 100 with rounded edges and with rounded corners or even round resonators can be advantageous.

It should be also mentioned that a step 32 (FIG. 11) in the bottom electrode 30 of a resonator structure 100 gives rise not only to loss, but also to a disturbed growth of the piezoelectric material in this region. Therefore it may be advantageous to design the top electrode 50 geometrically smaller than the bottom electrode 30.

LIST OF REFERENCE NUMERALS 100 resonator structure, in particular first resonator
100' resonator structure, in particular second resonator
10 substrate
12 air gap within the substrate 10
13 air gap between the substrate 10 and the bottom electrode 30
15 support layer at the edge of the air gap 13
20 reflector layer or reflector stack, in particular membrane
20' reflector layer or reflector stack, in particular set of acoustically mismatched layers 22, 24
22 reflector layer of low mechanical impedance
24 reflector layer of high mechanical impedance
30 bottom electrode layer, in particular bottom electrode
32 step in the bottom electrode layer 30
40 piezoelectric layer, in particular C-axis normal piezoelectric layer
50 top electrode layer, in particular top electrode
50p thick top electrode, in particular thick top metal layer, applied on the parallel resonator or shunt resonator
50s thin top electrode, in particular thin top metal layer, applied on the series resonator
52 pad of the top electrode layer 50
54 step in the top electrode layer 50
61 step in the dielectric layer 63
63 dielectric layer (associated with the bottom electrode layer 30)
65 dielectric layer (associated with the top electrode layer 50)
67 step in the dielectric layer 65
70 mass loading layer
72 step in the mass loading layer 70
80 field, in particular acoustic field, of the first resonator 100
80' field, in particular acoustic field, of the second resonator 100'
200 acoustically coupled resonator filter
$C_0$ static capacitance (cf. FIG. 3: prior art)
$C_1$ motional capacitance (cf. FIG. 3: prior art)
$C_P$ capacitance due to stray electric fields in the substrate 10 (cf. FIG. 3: prior art)
g distance between the resonators 100, 100'
l length of the resonators 100, 100'
$L_1$ motional inductance (cf. FIG. 3: prior art)
$L_s$ inductance in the electrodes and interconnect (cf. FIG. 3: prior art)
$R_1$ motional resistance (cf. FIG. 3: prior art)
$R_p$ resistance due to stray electric fields in the substrate 10 (cf. FIG. 3: prior art)
$R_s$ ohmic resistance in the electrodes 30, 50, 50p, 50s, 52 and interconnect
(cf. FIG. 3: prior art)
t thickness of the resonators 100, 100'
w width of the resonators 100, 100'

The invention claimed is:

1. A resonator structure in particular a bulk-acoustic-wave resonator, such as a film BAW resonator or a solidly-mounted BAW resonator comprising at least one substrate, at least one reflector layer applied or deposited on the substrate, at least one bottom electrode layer, in particular bottom electrode, applied or deposited on the reflector layer, at least one piezoelectric layer, in particular C-axis normal piezoelectric layer, applied or deposited on the bottom electrode layer, at least one top electrode layer, in particular top electrode, applied or deposited on the bottom electrode layer and/or on the piezoelectric layer such that the piezoelectric layer is between the bottom electrode layer and the top electrode layer, characterized by at least one dielectric layer applied or deposited in and/or on at least one space in at least one region of non-overlap between the bottom electrode layer and the top electrode layer, wherein the bottom electrode is deposited on a select portion of the reflector layer, said at least one dielectric layer associated with the bottom electrode is deposited on a remaining portion the reflector layer, and the top electrode is deposited on a select portion of the piezoelectric layer above the deposited dielectric layer and a portion of the bottom layer, such that the area of the deposited dielectric area represents the at least one non-overlapping region.

2. The resonator structure according to claim 1, wherein the dielectric layer is deposited in such way that the total thickness of the region of non-overlap between the bottom electrode layer and the top electrode layer is equal to the total thickness of the region of overlap between the bottom electrode layer and the top electrode layer thus implying a planarisation of the resonator structure or that the thickness of the dielectric layer as deposited in the region of non-overlap between the bottom electrode layer and the top electrode layer is chosen other than that required for planarisation.

3. The resonator structure according to claim 1, wherein at least one mass loading layer applied on the top electrode layer and/or on the dielectric layer.

4. The resonator structure according to claim 3, wherein the mass loading layer and/or the dielectric layer and/or the top electrode layer can be thickened in at least one region of at least one parallel resonator or shunt resonator and/or can be thinned opened and/or removed in at least one region of at least one series resonator.

5. The resonator structure according to claim 1, wherein the resonator structure comprises at least one rounded edge and/or that the top electrode layer is smaller than the bottom electrode layer.

6. The resonator structure according to claim 1, further comprising electrodes whose edges define the edge of the resonator, which are thin compared to the total thickness of the resonant cavity.

7. The resonator structure according to claim 6, further comprising an electrode thickness $d_e$ divided by thickness of resonant cavity $d_{rc}$ according to $1\% \leq d_e/d_{rc} \leq 10\%$.

8. A filter comprising at least one resonator structure comprising:
at least one substrate, at least one reflector layer applied or deposited on the substrate, at least one bottom electrode layer, in particular bottom electrode, applied or deposited on the reflector layer, at least one piezoelectric layer, in particular C-axis normal piezoelectric layer, applied or deposited on the bottom electrode layer, at least one top electrode layer, in particular top electrode, applied or deposited on the bottom electrode layer and/or on the piezoelectric layer such that the piezoelectric layer is between the bottom electrode layer and the top electrode layer, characterized by at least one dielectric layer applied or deposited in and/or on at least one space in at least one region of non-overlap between the bottom electrode layer and the top electrode layer wherein the bottom electrode is deposited on a select portion of the reflector layer and said at least one dielectric layer associated with the bottom electrode is deposited on a remaining portion the reflector layer and the top electrode is deposited on a select portion of the piezoelectric layer above the deposited dielectric layer and a portion of the bottom layer such that the area of the deposited dielectric area represents the at least one non-overlapping region.

9. The filter according to claim 8, wherein more than one closely-spaced resonator structure with widths of gaps between the resonator structures adjusted to give appropriate acoustic coupling and compatibility with mask design rules.

10. A method of producing a resonator structure in particular a bulk-acoustic-wave resonator:
 (i) applying or depositing at least one reflector layer on at least one substrate;
 (ii) applying or depositing at least one bottom electrode layer on a portion of the reflector layer and a dielectric layer on the remaining portion of the reflector layer;
 (iii) applying or depositing at least one piezoelectric layer, in particular C-axis normal piezoelectric layer, on the bottom electrode layer;
 (iv) applying or depositing at least one top electrode layer, in particular top electrode, on the bottom electrode layer and/or on the piezoelectric layer such that the piezoelectric layer is between the bottom electrode layer and the top electrode layer, wherein the top layer is positioned above the dielectric layer and a portion of the bottom electrode layer.

11. The method according to claim 10, (vi) applying or depositing at least one mass loading layer on the top electrode layer and/or on the dielectric layer wherein it is possible to open and/or to remove the mass loading layer and/or the dielectric layer in at least one region of at least one series resonator and/or to thicken the mass loading layer and/or the dielectric layer in at least one region of at least one parallel resonator or shunt resonator.

\* \* \* \* \*